United States Patent
Horie et al.

(10) Patent No.: US 7,463,169 B2
(45) Date of Patent: Dec. 9, 2008

(54) 64B/66B ENCODING DATA GENERATION METHOD AND CIRCUIT

(75) Inventors: Masayuki Horie, Kawasaki (JP); Yukio Suda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/877,831

(22) Filed: Oct. 24, 2007

(65) Prior Publication Data

US 2008/0100481 A1 May 1, 2008

(30) Foreign Application Priority Data

Oct. 27, 2006 (JP) ............................. 2006-292904

(51) Int. Cl.
 *H03M 7/00* (2006.01)
(52) U.S. Cl. .......................... 341/60; 341/50
(58) Field of Classification Search .............. 341/50–90
 See application file for complete search history.

(56) References Cited

U.S. PATENT DOCUMENTS

| | | | |
|---|---|---|---|
| 5,517,660 A * | 5/1996 | Rosich | 711/117 |
| 6,967,601 B2 * | 11/2005 | Bossen | 341/107 |
| 7,127,645 B2 | 10/2006 | Toyoda et al. | |
| 7,183,951 B2 * | 2/2007 | Bossen | 341/107 |

FOREIGN PATENT DOCUMENTS

| | | |
|---|---|---|
| JP | 2004-193817 | 7/2004 |
| JP | 2004-289567 | 10/2004 |
| JP | 2004-320580 | 11/2004 |

* cited by examiner

*Primary Examiner*—Lam T Mai
(74) *Attorney, Agent, or Firm*—Katten Muchin Rosenman LLP

(57) ABSTRACT

In a more effective data generation method and circuit used for 64B/66B encoding, when packet data, and head and tail information of the data packet are received, write user data in which a head and tail identifying bytes are respectively added to a head and a tail of the packet data based on the head and tail information is associated with control data indicating positions of both of the identifying bytes to be written in a memory sequentially from a predetermined address of the memory. From the predetermined address, user data by 8 bytes and the control data corresponding to the user data are sequentially read to be provided to a 64B/66B encoding circuit. During a period in which the reading can not be made, idle bytes for 8n bytes ($n \geq 1$) and control data indicating the idle bytes, or maintenance user data of 8n bytes ($n \geq 2$) in which the head and tail identifying bytes are respectively added to a head and a tail of the maintenance information and control data indicating positions of both of the identifying bytes are provided to the 64B/66B encoding circuit.

10 Claims, 8 Drawing Sheets

64B/66B ENCODING DATA GENERATION METHOD AND CIRCUIT

BACKGROUND OF THE INVENTION

1. Field of the Invention

The present invention relates to a data generation method and circuit, and in particular to a generation method and circuit of data used for a 64B/66B encoding circuit.

2. Description of the Related Art

A data generation technology for 64B/66B encoding is applied to various places as shown by hatching in FIG. 5, i.e., an optical interface 10 within a transmission device 1 and a backboard transmitter 20 within a relay device 2 in a network which performs 64B/66B encoding to packet data like an Ethernet (registered trademark) packet, an IP packet, and the like to be transmitted.

Hereinafter, a prior art example of the data generation technology for 64B/66B encoding will be described referring to FIGS. 6, 7A, 7B, and 8.

Prior Art Example: FIGS. 6, 7A, 7B, and 8

In the prior art transmission device 1 shown in FIG. 6, a transmission processor 100 composing the optical interface 10 firstly receives packet data PD from the outside of the transmission device 1, and extracts the packet data PD, and its head and tail information SI and TI to be provided to an internal 64B/66B encoding data generation circuit 1000.

The 64B/66B encoding data generation circuit 1000 having received the data and the information sequentially generates user data UD by 64 bits (8 bytes) from the packet data PD, and 8-bit (1-byte) control data CD corresponding to each of the user data UD, and provides the generated data to a 64B/66B encoding circuit 200, thereby making the encoding circuit 200 perform encoding.

The 64B/66B encoding rule prescribes that the patterns of the user data UD and the control data CD to be provided to the 64B/66B encoding circuit 200 assume, as shown in the following, any one of patterns PTN1-PTN12 shown in FIG. 7A according to states of (1) an idle period when no packet data PD is received, (2) a start of a packet data PD reception, (3) the packet data PD reception, and (4) an end of the packet data PD reception.

Namely, a table in FIG. 7A shows 12 patterns PTN1-PTN12 of conversion relationships from the user data UD and the control data CD before encoding into encoded data ED after encoding. The 64B/66B encoding data generation circuit 1000 generates the user data UD and the control data CD corresponding to any of the patterns PTN1-PTN12, thereby enabling the 64B/66B encoding circuit 200 to generate the encoded data ED corresponding to the patterns PTN1-PTN12 as will be described in the following.

Also, as seen from FIG. 7A, idle bytes C0-C7 before encoding are respectively composed of 8 bits, while the idle bytes C0-C7 after encoding are respectively composed of 7 bits.

Also, the specification of the 64B/66B encoding rule is formed based on 4-byte data, which is referred to as 4 lanes. In the specification, the head of the data is located at the head of the 4 lanes. Therefore, the head position upon converting 4-byte data into 8-byte data is the 5th (pattern PTN2) or the 1st byte (pattern PTN3) within the 8 bytes.

(1) During Idle Period (Pattern PTN1)

During the idle period, the 64B/66B encoding data generation circuit 1000 generates, as shown in the pattern PTN1, the user data UD in which the idle bytes C0-C7 for 8 bytes are set and the control data CD ("11111111") indicating that only the idle bytes C are set therein.

(2) Upon Start of Packet Data Reception (Pattern PTN2 or PTN3)

When receiving the head information SI of the packet data PD, the 64B/66B encoding data generation circuit 1000 generates the user data UD and the control data CD of the pattern PTN2 or the pattern PTN3 described hereinbelow according to phase conditions of a generation timing of the user data UD and a transition timing to the start of the packet data reception from the idle period.

When the idle period transitions to the start of the packet data reception during the generation of the user data UD, the 64B/66B encoding data generation circuit 1000 generates the user data UD in which the idle bytes C0-C3 for 4 bytes, a head identifying byte S4 of the packet data PD, data bytes D5-D7 for 3 bytes from the head of the packet data PD shown in the pattern PTN2 are set, and the control data CD ("11111000") indicating the positions of the idle bytes C0-C3 and the head identifying byte S4 within the user data UD.

When the generation timing of the user data UD arrives immediately after the start of the packet data reception, the 64B/66B encoding data generation circuit 1000 generates the user data UD in which a head identifying byte S0 of the packet data PD, data bytes D1-D7 for 7 bytes from the head of the packet data PD shown in the pattern PTN3 are set, and the control data CD ("10000000") indicating the position of the head identifying byte S0 within the user data UD.

(3) During Packet Data Reception (Pattern PTN4)

The 64B/66B encoding data generation circuit 1000 generates, as shown in the pattern PTN4, the user data UD in which the data bytes D0-D7 for 8 bytes are sequentially set from the packet data PD continuously received, and the control data CD ("00000000") indicating that none of the idle byte C, head identifying byte S, and tail identifying byte T which will be described later is set in the user data UD.

(4) Upon End of Packet Data Reception (Patterns PTN5-PTN12)

When receiving tail information TI of the packet data PD, the 64B/66B encoding data generation circuit 1000 generates, according to a transfer status of the packet data PD as shown in the patterns PTN5-PTN12, user data UD in which tail identifying bytes T0-T7 are respectively added to a head or data bytes T0-T6 of a tail of the packet data PD, and idle bytes C for remaining bytes are further set, and the control data CD indicating the positions of the tail identifying bytes T0-T7 and the idle bytes C within the user data UD.

The 64B/66B encoding circuit 200 having received the user data UD and the control data CD generated as the above-mentioned (1)-(4) generates a parallel scrambled data SD of e.g. 16 bits in which encoding and scrambling based on the control data CD are applied to the user data UD, as shown in FIG. 6, and synchronizes the scrambled data SD with a clock CLK supplied from a P/S converter 30 to be outputted.

The 64B/66B encoding circuit 200 has, as shown in a general arrangement in FIG. 7B, a 64B/66B encoding processor 210 for encoding the user data UD and the control data CD to generate parallel encoded data ED of 66 bits, a FIFO buffer BUF for temporarily storing the encoded data ED, a scrambler 220 for reading the encoded data ED from the buffer BUF to generate scrambled data SD, a gear box 230 for performing a rate conversion to the scrambled data SD outputted from the scrambler 220 into parallel data of 64 bits, and a multiplexer 240 further multiplexing the scrambled data SD to which the rate conversion is performed by the gear box 230 and performing the rate conversion (4:1) into parallel data of 16 bits to be provided to the P/S converter 30.

Also, a clock CLK_IQ that is an internal clock CLK_I of the optical interface 10 supplied to the 64B/66B encoding data generation circuit 1000 and divided into four by a clock divider 250_1 is supplied to the 64B/66B encoding processor

210. It is to be noted that the clock division number "four" corresponds to a case where the packet data PD is supposed to be the parallel data of 16 bits as shown in FIG. 7B (namely, where the transmission rate of the user data UD (64 bits) is ¼ (=¹⁶⁄₆₄) times the transmission rate of the packet data PD (16 bits)), so that the clock division number of the clock divider 250_1 may be appropriately changed according to a parallel bit number of the packet data PD.

Also, a clock CLK_Q that is the clock CLK outputted by the P/S converter 30 divided into four by the clock divider 250_2 is supplied to the input side of the scrambler 220, the gear box 230, and the multiplexer 240, and the clock CLK is supplied to the output side of the multiplexer 240 as it is.

In operation, every time the user data UD and the control data CD generated by the 64B/66B encoding data generation circuit 1000 is received, the 64B/66B encoding processor 210 generates the encoded data ED according to the encoding rule shown in FIG. 7A from the user data UD and the control data CD, to be sequentially written in the FIFO buffer BUF.

The encoding data ED is data of 66 bits composed of a payload PL of 64 bits generated from the user data UD based on the control data CD, and a synchronous header HD of 2 bits added to the payload PL. In the synchronous header HD, "01" is set when the control data CD is "00000000" (in the case of pattern PTN1), and "10" is set in other cases (in the case of patterns PTN2-PTN12).

Also, the payload PL is set according to the patterns PTN1-PTN12 as follows:

Pattern PTN1

The 64B/66B encoding processor 210 sets in the payload PL a pattern identifying byte PI1 (0x1e) identifying the pattern PTN1, and the idle bytes C0-C7 respectively reduced to 7 bits.

Pattern PTN2

The 64B/66B encoding processor 210 sets in the payload PL a pattern identifying byte PI2 (0x33) identifying the pattern PTN2, the idle bytes C0-C3 respectively reduced to 7 bits, a padding PAD for 4 bits, and the data bytes D5-D7.

Pattern PTN3

The 64B/66B encoding processor 210 sets in the payload PL a pattern identifying byte PI3 (0x78) identifying the pattern PTN3, and the data bytes D1-D7.

Pattern PTN4

The 64B/66B encoding processor 210 sets in the payload PL the data bytes D0-D7 as they are.

Pattern PTN5

The 64B/66B encoding processor 210 sets in the payload PL a pattern identifying byte PI5 (0x87) identifying the pattern PTN5, a padding PAD for 7 bits, and the idle bytes C1-C7 respectively reduced to 7 bits.

Patterns PTN6-PTN11

The 64B/66B encoding processor 210 sets in the payload PL pattern identifying bytes PI6-PI11 (0x99, 0xaa, 0xb4, 0xcc, 0xd2, and 0xe1) respectively identifying the patterns PTN6-PTN11, the data bytes D0, D0-D1, D0-D2, D0-D3, D0-D4, and D0-D5, the idle bytes C1-C7, C2-C7, C3-C7, C4-C7, C5-C7, C6-C7, and C7 respectively reduced to 7 bits, and a padding PAD compensating lacking bits between the data byte D and the idle byte C.

Pattern PTN12

The 64B/66B encoding processor 210 sets in the payload PL a pattern identifying byte PI12 (0xff) identifying the pattern PTN12 and the data bytes D0-D6.

The scrambler 220 sequentially reads the encoded data ED from the FIFO buffer BUF, and provides to the gear box 230 the scrambled data SD that is the read encoded data ED to which the scrambling is applied. The gear box 230 provides the scrambled data SD sequentially received to the multiplexer 240 per 64 bits. The multiplexer 240 multiplexes the scrambled data SD into the parallel data of 16 bits to be provided to the P/S converter 30.

The P/S converter 30 having received the parallel data, as shown in FIG. 6, performs a serial conversion to the scrambled data SD to be transmitted to the network through the output port OP.

In the 64B/66B decoding, an S/P converter 40 having received the scrambled data SD through the input port IP generates (recovers) the clock CLK, and provides to a 64B/66B decoding circuit 300 the scrambled data SD to which a parallel conversion has been performed in synchronization with the clock CLK. The 64B/66B decoding circuit 300 having received the scrambled data SD provides to a reception processor 400 the user data UD and the control data CD obtained by descrambling and decoding the scrambled data SD. The reception processor 400 assembles the original packet data PD from the user data UD to be outputted to the outside.

Also, FIG. 8 shows a general arrangement of the relay device 2 shown in FIG. 5. In the relay device 2, S/P converters 40_1-40_n having received the scrambled data SD respectively through input ports IP1-IPn firstly provide the scrambled data SD to which the parallel conversion has been performed in synchronization with clocks CLK_1-CLK_n, in the same way as the 64B/66B decoding shown in FIG. 6, to 64B/66B decoding circuits 300_1-300_n composing the backboard transmitter 20. The 64B/66B decoding circuits 300_1-300_n respectively provide the user data UD and the control data CD obtained by descrambling and decoding the scrambled data SD to reception processors 400_1-400_n.

The reception processors 400_1-400_n respectively provide the packet data PD assembled from the user data UD to a switch portion 500.

The switch portion 500 having received the packet data PD from any of the reception processors 400_1-400_n performs switching based on destination information or the like set in the header (not shown) of the packet data PD. The packet data PD and the head information SI and the tail information TI thereof are provided to any of the 64B/66B encoding data generation circuits 1000_1-1000_n.

The 64B/66B encoding data generation circuits 1000_1-1000_n having received the data and the information respectively generate the user data UD and the control data CD from the packet data PD in the same way as the 64B/66B encoding data generation circuit 1000 within the transmission device 1 shown in FIG. 6 to be provided to 64B/66B encoding circuits 200_1-200_n. The 64B/66B encoding circuits 200_1-200_n respectively provide to P/S converters 30_1-30_n the scrambled data SD that is the user data UD to which encoding and scrambling have been performed. The P/S converters 30_1-30_n respectively perform the serial conversion to the scrambled data SD to be transmitted through output ports OP1-OPn.

It is to be noted that the following (1)-(3) can be mentioned as reference examples:

REFERENCE EXAMPLE (1)

An encoding circuit which improves the 64B/66B encoding rule, forms an encoding conversion byte composed of control data and its parity information or the like when the user data includes a byte except the data byte, and rearranges the user data in order of the encoding conversion byte → the byte except the data byte → the data byte (see e.g. patent document 1).

REFERENCE EXAMPLE (2)

An encoding device which divides parallel byte rows of 8+4n (n≧0) lanes into super lanes by 4 lanes, extracts user data of 64 bits from 2 columns per super lane, and performs 64B/66B encoding (see e.g. patent document 2).

REFERENCE EXAMPLE (3)

A skew adjustment device monitoring skew which occurs when a plurality of serial signals are transmitted by replacing idle data with a skew adjustment pattern (see e.g. patent document 3).

[Patent document 1] Japanese patent application laid-open No. 2004-320580

[Patent document 2] Japanese patent application laid-open No. 2004-289567

[Patent document 3] Japanese patent application laid-open No. 2004-193817

In the above-mentioned prior art, the user data generated upon start of the packet data reception assumes the pattern PTN2 or PTN3 shown in FIG. 7A. In the case of the pattern PTN2, there has been a problem that a packet data transfer efficiency (the number of data bytes/the number of bytes of all of the user data) to the 64B/66B encoding circuit deteriorates due to the idle data of 4 bits included in the user data.

If the user data is generated from the packet data of e.g. 30 bytes in the following case (1) including the pattern PTN2 and in the following case (2) including the pattern PTN3, the packet data transfer efficiency assumes "93.75%" (30 bytes/ 32 bytes) in the case (2), but deteriorates to "75%" (30 bytes/ 40 bytes) in the case (1):

Case (1)

Pattern PTN2 (the number of data bytes="3", the number of bytes except data bytes="5")→pattern PTN4×3 times (the number of data bytes="24 (8×3)")→pattern PTN8 (the number of data bytes="3", the number of bytes except data bytes="5")

Case (2)

Pattern PTN3 (the number of data bytes="7", the number of bytes except data bytes="1")→pattern PTN4×2 times (the number of data bytes="16 (8×2)")→pattern PTN12 (the number of data bytes="7", the number of bytes except data bytes="1")

SUMMARY OF THE INVENTION

It is accordingly an object of the present invention to provide a more effective generation method and circuit of data used for 64B/66B encoding.

[1] In order to achieve the above-mentioned object, a 64B/ 66B encoding data generation method (or circuit) according to one aspect of the present invention comprises: a first step of (portion) generating, when packet data, and head and tail information of the packet data are received, user data in which a head and tail identifying bytes are respectively added to a head and a tail of the packet data based on the head and tail information, and control data indicating positions of both of the identifying bytes in the user data; a second step of (portion) writing the user data associated with the control data in a memory sequentially from a predetermined address of the memory; and a third step of (portion) sequentially reading the user data by 8 bytes and the control data corresponding to the user data from the predetermined address of the memory, to be provided to a 64B/66B encoding circuit.

Namely, at the first step (or portion), user data starting from a head identifying byte and control data thereof are generated starting with a reception of packet data received at random. At the second step (or portion), the user data and the control data are associated with each other to be sequentially written in a memory from a predetermined address.

At the third step (or portion), in spite of the reception state of the packet data, the user data by 8 bytes and the control data corresponding thereto are sequentially read from the predetermined address of the memory to be provided to the 64B/ 66B encoding circuit.

Thus, it is possible to sequentially provide the user data starting from the pattern PTN3 shown in FIG. 7A to the 64B/66B encoding circuit.

[2] Also, in the above-mentioned [1], the third step (or portion) may include a step of (portion) generating, when a period in which the reading from the memory can not be made is detected, idle bytes for 8n bytes (n≧1) and control data indicating the idle bytes during the period, to be provided to the 64B/66B encoding circuit.

Namely, when the user data and the control data which are readable are not written in the memory depending on a length of the idle period in which the packet data is not transmitted, the user data and the control data of the pattern PTN1 shown in FIG. 7A can be provided to the 64B/66B encoding circuit.

[3] Also, in the above-mentioned [1], the first step (portion) may include a step of (portion) adding, when a data length of the user data is less than 8n bytes (n≧2), idle bytes for lacking bytes to the tail of the user data, and of adding data indicating positions of the idle bytes to the control data.

Namely, it is possible to provide the user data and the control data of any of the patterns PTN5-PTN11 shown in FIG. 7A to the 64B/66B encoding circuit when the packet data reception is finished.

[4] Also, the above-mentioned [1] further comprises a fourth step of (portion) collecting maintenance information of 8n−2 bytes (n≧2) from outside, and the third step (portion) may include a step of (portion) generating, when a period in which the reading from the memory can not be made is detected, maintenance user data of 8n bytes in which the head and tail identifying bytes are respectively added to a head and a tail of the maintenance information, and control data indicating positions of both of the identifying bytes in the maintenance user data during the period, to be provided to the 64B/66B encoding circuit.

Namely, the period in which the reading from the memory can not be made is efficiently used, so that maintenance user data generated from maintenance information according to the 64B/66B encoding rule instead of the idle data and the control data are provided to the 64B/66B encoding circuit. It is to be noted that the contents of the maintenance information may be anything, for example, information for monitoring of a transmission fault or for performing the skew monitoring as the above-mentioned reference example (3) can be set therein.

Also, the idle data is simply replaced with the skew adjustment pattern in the above-mentioned reference example (3), whereas since it is not a data pattern in conformity to the 64B/66B encoding rule, there is a possibility that the skew adjustment pattern will be discarded or cause a malfunction in the 64B/66B encoding circuit or a device at a latter stage.

However, in the above-mentioned [4], the maintenance user data is generated in the data pattern prescribed in the 64B/66B encoding rule, so that the transmission within the network can be performed without any occurrence of the malfunction as mentioned above.

Also, in the above-mentioned [1], the packet data may comprise an Ethernet packet or an IP packet.

According to the present invention, the data used for the 64B/66B encoding can be efficiently generated, so that the packet data transfer efficiency to the 64B/66B encoding circuit can be improved. Therefore, the transmission efficiency of the entire network including the transmission device, the relay device, and the like to which the present invention is applied can be improved.

Also, since the maintenance information can be provided to the 64B/66B encoding circuit as the maintenance user data in conformity to the 64B/66B encoding rule, a maintenance can be easily performed without changing the specification of the 64B/66B encoding circuit, other devices, or the like.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Embodiments [1] and [2] of the 64B/66B encoding data generation method according to the present invention and a circuit using the method will now be described in the following order by referring to FIGS. 1-4.

I. Embodiment [1] FIGS. 1 and 2

Figure 1:
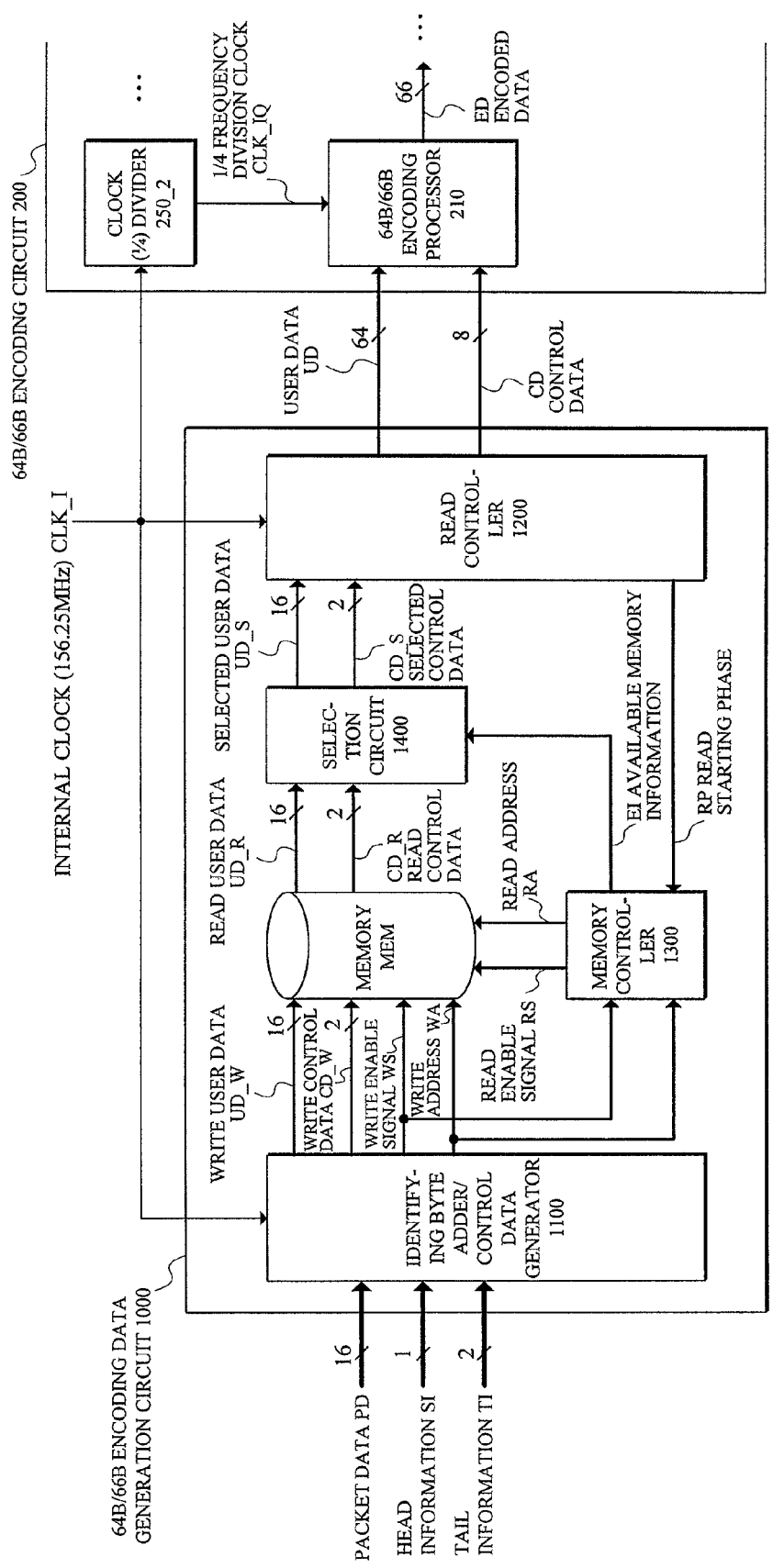
FIG. 1 is a block diagram showing an embodiment [1] of a 64B/66B encoding data generation method and circuit according to the present invention.
Figure 2:
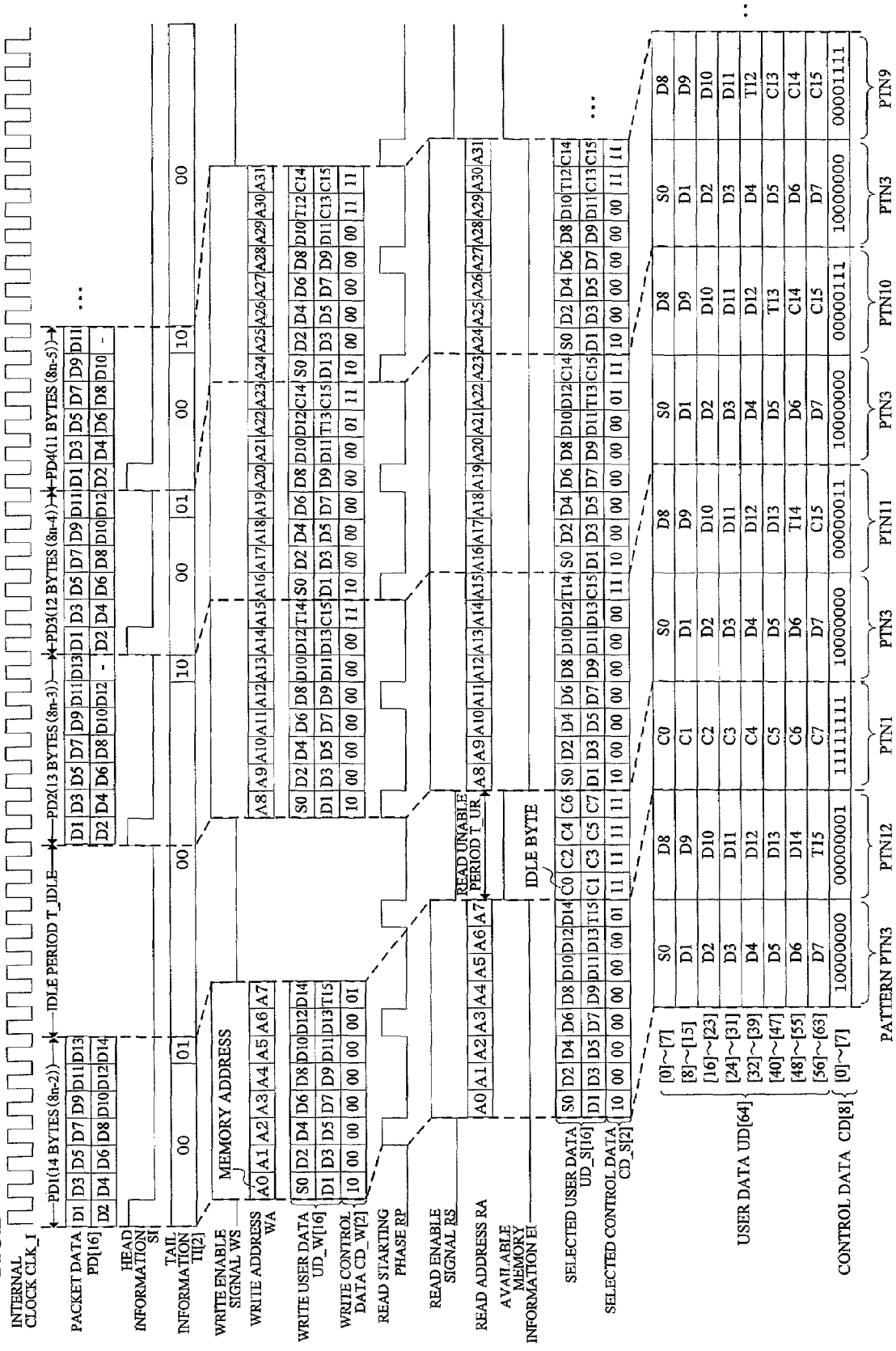
FIG. 2 is a time chart showing an operation example of an embodiment [1] of a 64B/66B encoding data generation method and circuit according to the present invention.

I.1. Arrangement: FIG. 1
I.2. Operation example: FIG. 2

II. Embodiment [2] FIGS. 3 and 4

Figure 3:
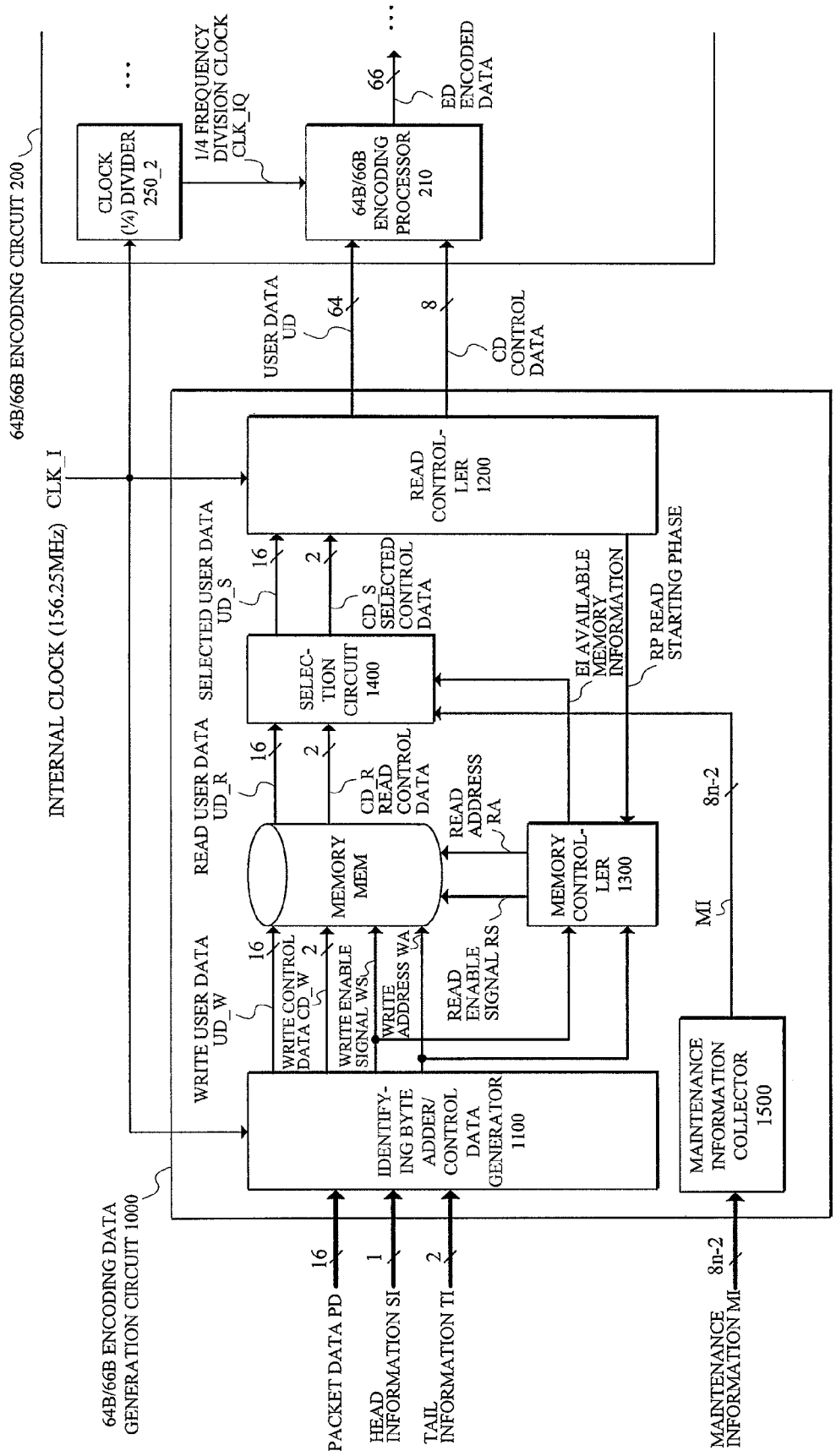
FIG. 3 is a block diagram showing an embodiment [2] of a 64B/66B encoding data generation method and circuit according to the present invention.
Figure 4:
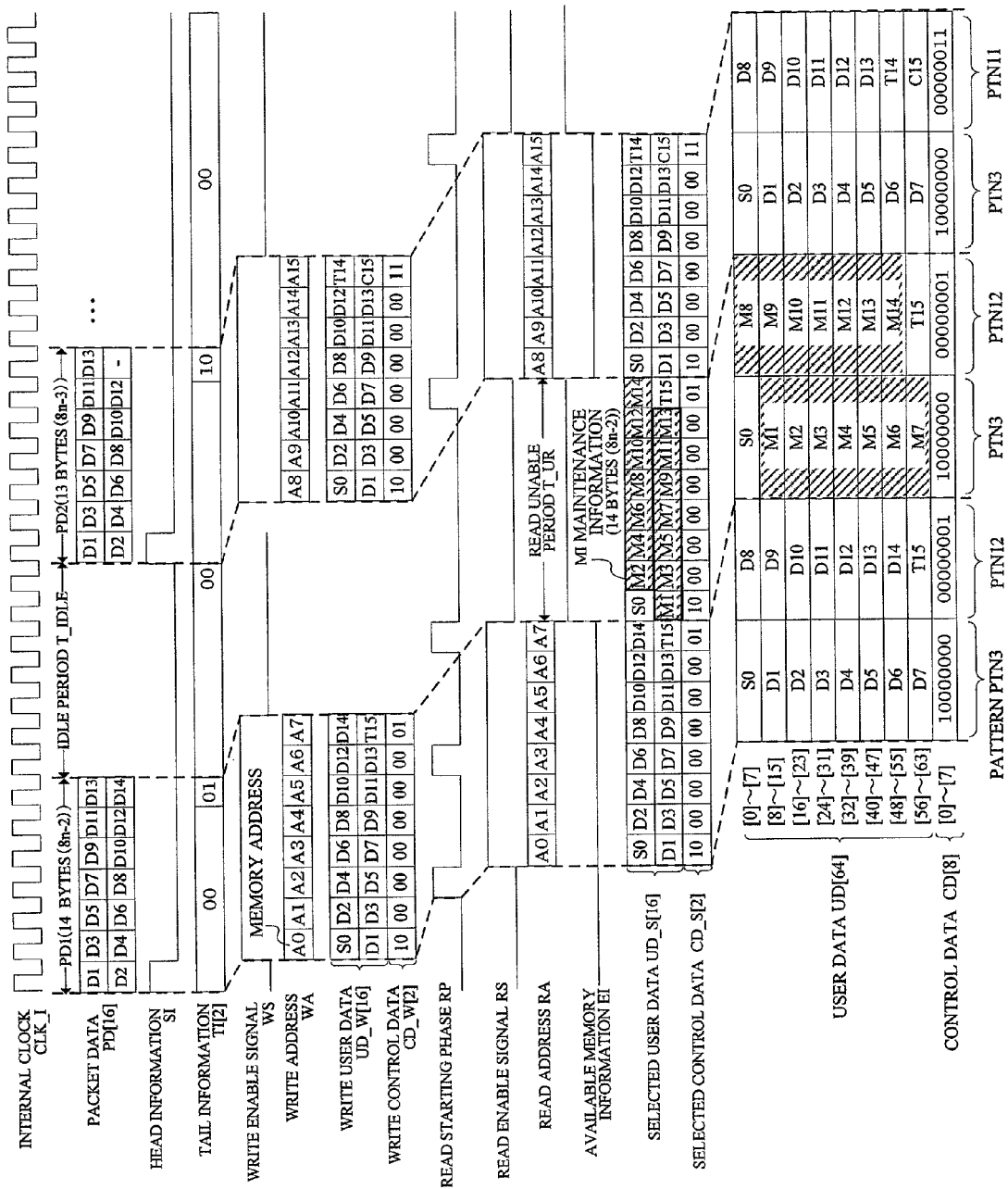
FIG. 4 is a time chart showing an operation example of an embodiment [2] of a 64B/66B encoding data generation method and circuit according to the present invention.
Figure 5:
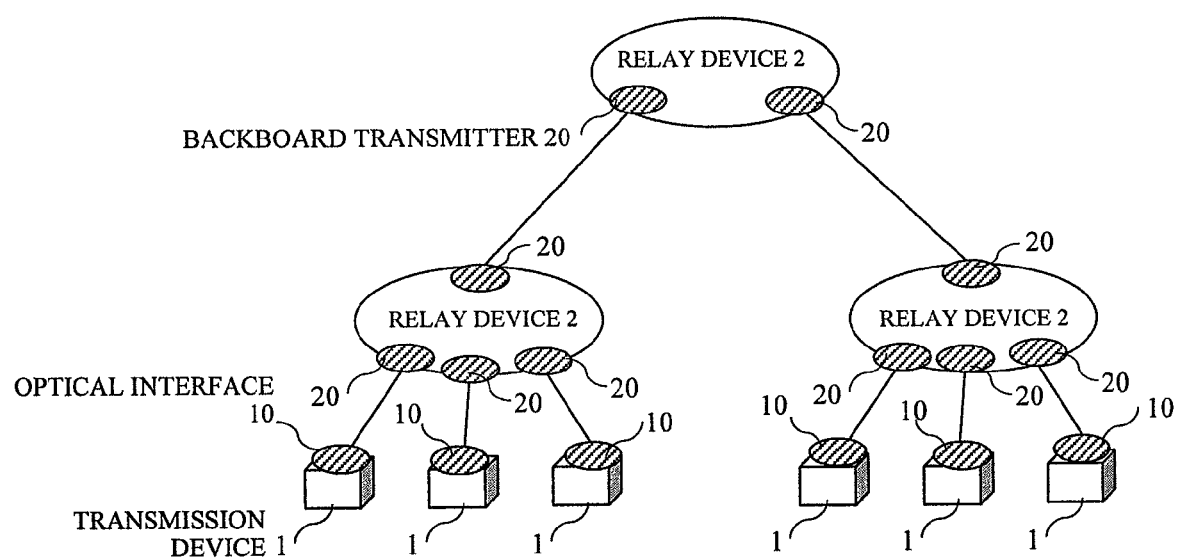
FIG. 5 is a block diagram showing places in a communication system to which the present invention and the prior art example are applied.
Figure 6:
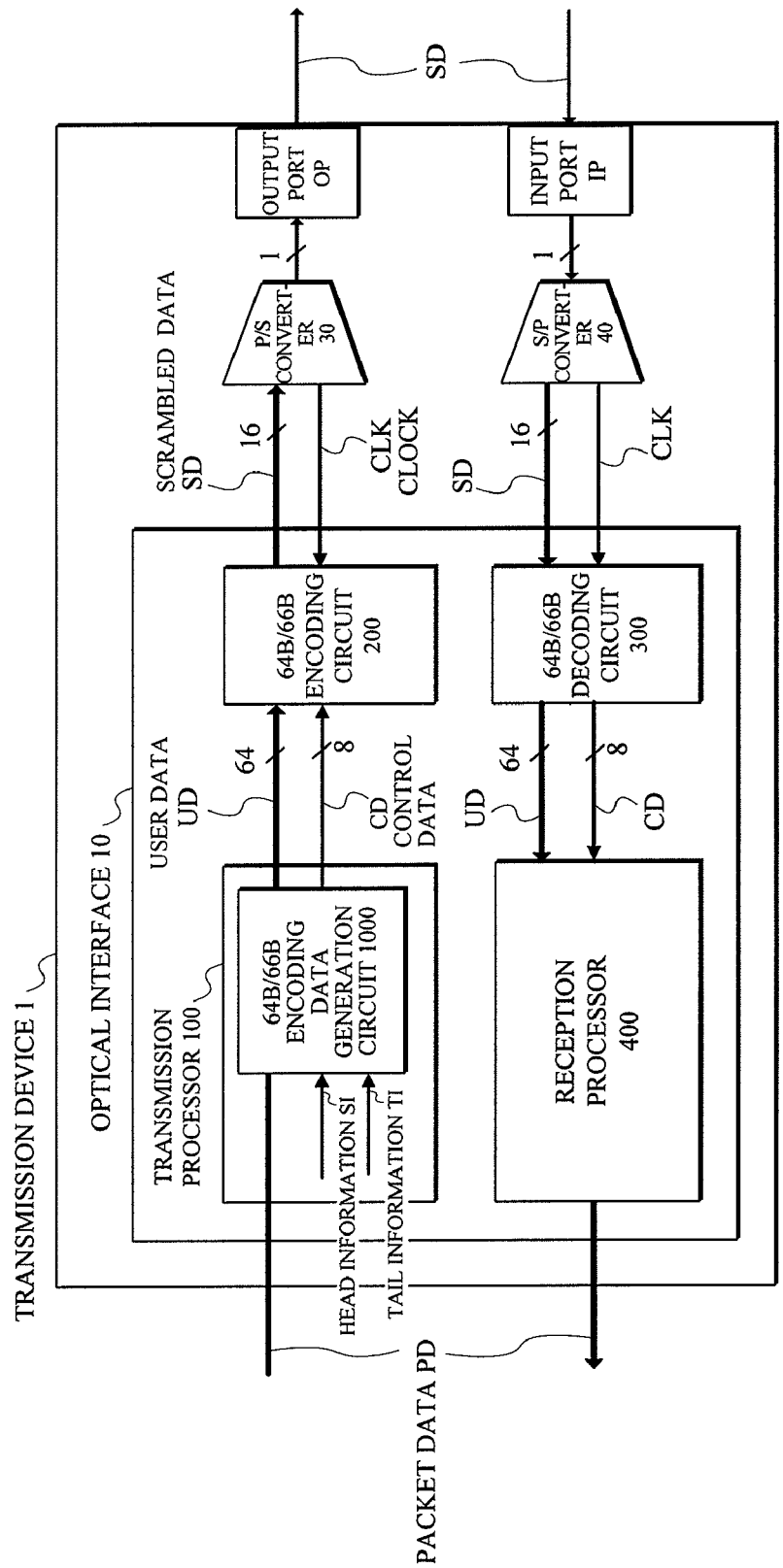
FIG. 6 is a block diagram showing a general arrangement of a transmission device.

II.1. Arrangement: FIG. 3
II.2. Operation example: FIG. 4

I. Embodiment [1] FIGS. 1 and 2

I.1. Arrangement: FIG. 1

Figure 7A:
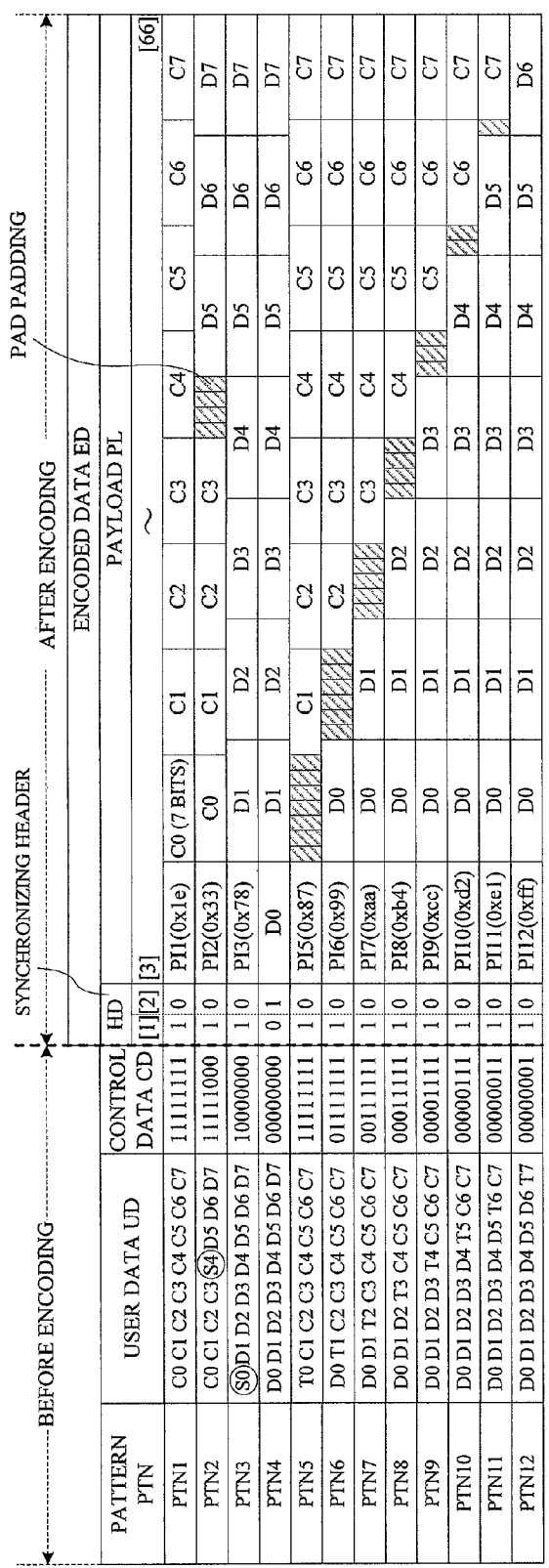
FIGS. 7A and 7B are diagrams showing a general 64B/66B encoding example.
Figure 7B:
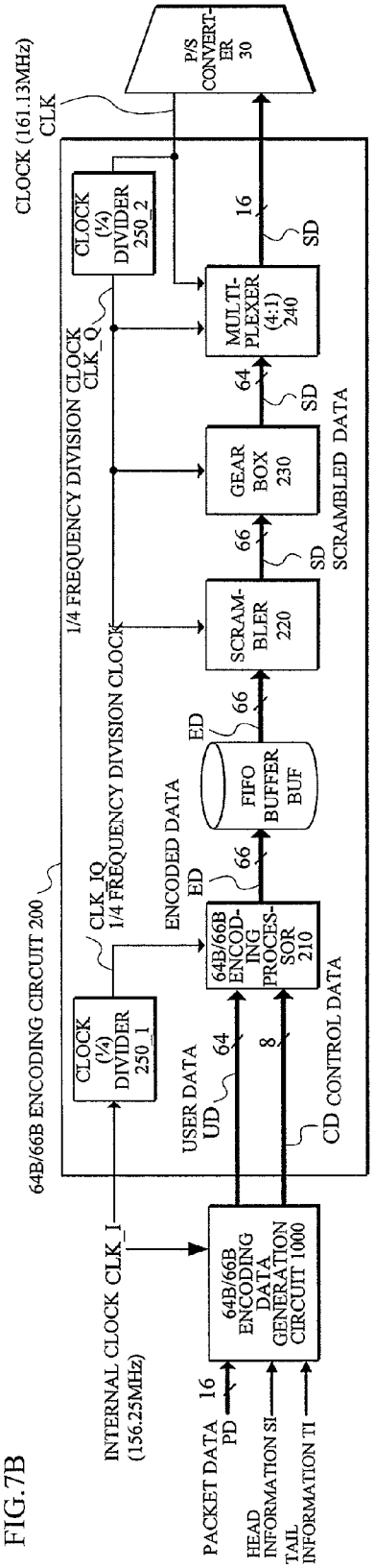
Figure 8:
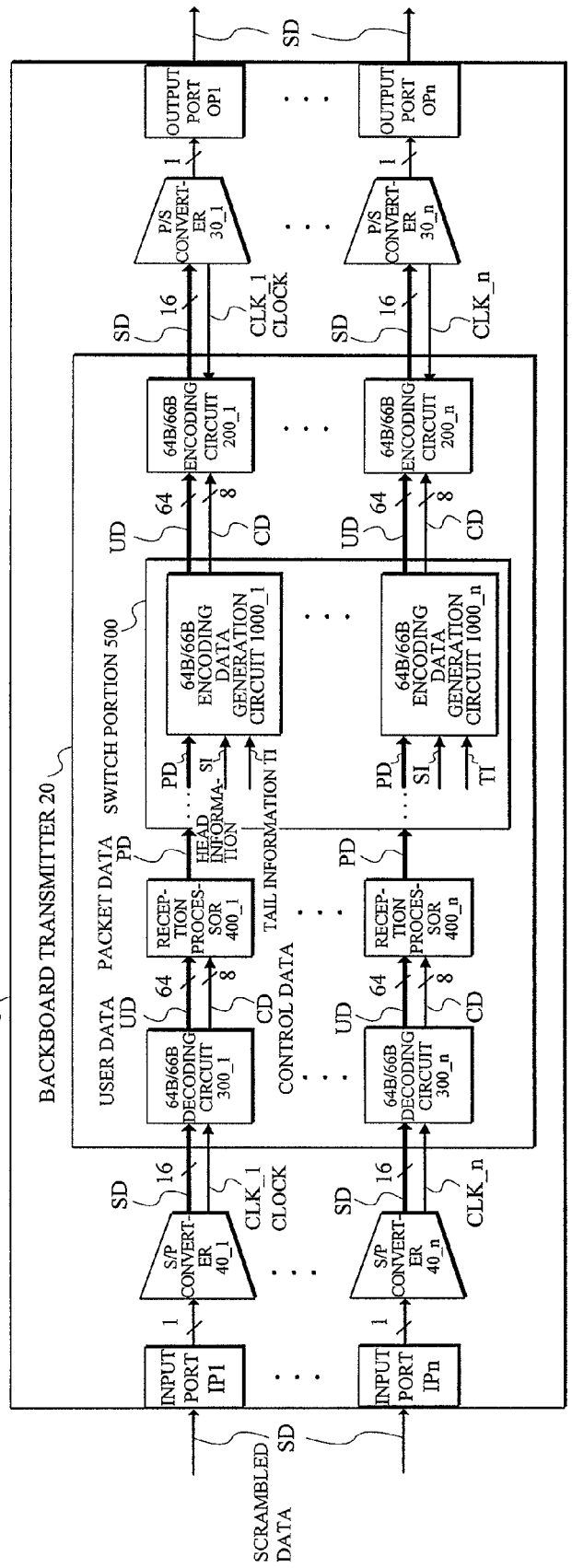
FIG. 8 is a block diagram showing a general arrangement of a relay device.

A 64B/66B encoding circuit 200 which is the same as that shown in FIG. 7B is connected to a 64B/66B encoding data generation circuit 1000 according to the embodiment [1] of the present invention shown in FIG. 1. An internal clock CLK_I common to the 64B/66B encoding circuit 200 is supplied to an identifying byte adder/control data generator 1100 and a read controller 1200 composing the 64B/66B encoding data generation circuit 1000.

The identifying byte adder/control data generator 1100 is a functional block of generating write user data UD_W in which a head and tail identifying bytes are respectively added to a head and a tail of the packet data PD based on head information SI and tail information TI of the packet data PD inputted in synchronization with the internal clock CLK_I, and write control data CD_W indicating positions of both of the identifying bytes within the data UD_W, and of associating the write user data UD_W and the write control data CD_W with each other to be written in a memory MEM from a predetermined write address (e.g. head address) WA in synchronization with a write enable signal WS.

It is to be noted that while in this embodiment the packet data PD is made 16-bit (2-byte) parallel data as an example and correspondingly the write user data UD_W and the write control data CD_W are respectively made 2-byte parallel data and 2-bit parallel data indicating each byte within the 2-byte parallel data, the number of parallel bits of the write user data UD_W and the write control data CD_W can be appropriately modified according to the number of parallel bits of the packet data PD. Also in this case, the following description can be similarly applied. Also, the same applies to read user data UD_R, read control data CD_R, selected user data UD_S, and selected control data CD_S, which will be described later.

The read controller 1200 sequentially generates a read starting phase RP for reading the user data UD of 64 bits (8 bytes) and the control data CD of 8 bits (1 byte) corresponding thereto from the memory MEM based on the internal clock CLK_I, and provides the read starting phase RP to a memory controller 1300. Also, the read controller 1200 provides to the 64B/66B encoding circuit 200 the user data UD and the control data CD obtained by combining selected user data UD_Ss and combining selected control data CD_Ss outputted from a selection circuit 1400.

Also, the memory controller 1300 monitors the write enable signal WS and the write address WA outputted from the identifying byte adder/control data generator 1100, and determines whether or not the reading from the memory MEM can be made every time the read starting phase RP is received from the read control 1200. The memory controller 1300 provides to the memory MEM a read enable signal RS and a read address RA of the memory MEM or generates available memory information EI to be provided to the selection circuit 1400. The selection circuit 1400 receives the read user data UD_R and the read control data CD_R read from the memory MEM by the read enable signal RS and the read address RA from the memory controller 1300, or receives the available memory information EI, and provides the read user data UD_R and the read control data CD_R, or idle bytes of 8 bytes and control data indicating the idle bytes to the read controller 1200 as the selected user data UD_S and the selected control data CD_S.

It is to be noted that the clock CLK_IQ that is the internal clock CLK_I divided into four by the clock divider 250_1, in the same way as in FIG. 7B, is supplied to the 64B/66B encoding processor 210 in the 64B/66B encoding circuit 200.

I.2. Operation Example: FIG. 2

Hereinafter, the operation of this embodiment will be described taking as an example the case where the packet data PD is inputted in order of the following (1)-(5) as shown in FIG. 2:

(1) Packet data PD1 of 14 bytes (8n−2 bytes: n=2)

(2) Idle period T_IDLE (3) Packet data PD2 of 13 bytes (8n−3 bytes)

(4) Packet data PD3 of 12 bytes (8n−4 bytes)

(5) Packet data PD4 of 11 bytes (8n−5 bytes)

It is to be noted that the following description is similarly applied to the case where n≧3.

(1) Packet Data PD1 (14 Bytes (8n−2))

In the write operation to the memory MEM upon reception of the packet data PD1, the identifying byte adder/control data generator 1100 firstly recognizes that the data byte D1 is the head of the packet data PD1 based on the head information SI, and generates write user data UD_W "S0, D1" of 16 bits where the head identifying byte S0 is added before the data byte D1, and write control data CD_W "10" of 2 bits indicating the position of the head identifying byte S0.

The identifying byte adder/control data generator 1100 writes both of the generated data in the write address WA="address A0" of the memory MEM with the write enable signal WS being turned "ON" (enable), and provides the write enable signal WS and the write address WA to the memory controller 1300.

Thereafter, until the tail information TI of the packet data PD1 is received, the identifying byte adder/control data generator 1100 makes the data bytes D2 and D3, D4 and D5, ..., D12 and D13 in the packet data PD1 the write user data UD_W, generates write control data CD_W "00" corresponding thereto, and writes the write user data UD_W and the write control data CD_W "00" in addresses A1-A6 of the memory MEM in the same way as the above. In this embodiment, the tail information TI is made 2-bit parallel data, indicated by "10" (data byte of upper stage in FIG. 2) or "01" (data byte of lower stage) which data byte among the 2-byte parallel packet data PD inputted per 1 clock of the internal clock CLK_I is the tail.

When receiving tail information TI "01", the identifying byte adder/control data generator 1100 recognizes that the data byte D14 is the tail of the packet data PD1, and generates write user data UD_W "D14, T15" in which a tail identifying byte T15 is added after the data byte D14, and write control data CD_W "01" of 2 bits indicating the position of the tail identifying byte T15.

After writing both of the generated data in the address A7 of the memory MEM in the same way as the above, the identifying byte adder/control data generator 1100 stops writing in the memory MEM with the write enable signal RS being turned "OFF" (disable).

On the other hand, the reading from the memory MEM operates asynchronously with the above-mentioned write operation. The read controller 1200 provides to the memory controller 1300 the periodical read starting phase RP with 4 clocks of the internal clock CLK_I being one cycle, whereby the reading is started. The reason why the cycle of the read starting phase RP is made 4 clocks of the internal clock CLK_I is because the write user data UD_W for 8 bytes (2 bytes×4 clocks) is written in the memory MEM in this period.

In the example shown in FIG. 2, when receiving the first read starting phase RP, the memory controller 1300 has already received the address where writing the user data UD_W and the control data CD_W in the memory MEM has been completed from the identifying byte adder/control data generator 1100. Therefore, the memory controller 1300 determines that the reading from the memory MEM can be made, thereby sequentially providing the read address RA to the memory MEM with the read enable signal RS being turned "ON".

When the addresses A0-A3 are sequentially provided to the memory MEM as the read address RA, read user data UD_Rs and read control data CD_Rs respectively written in the addresses A0-A3 are read to be provided to the selection circuit 1400, which provides to the read controller 1200 the data as they are, as selected user data UD_Ss "S0, D1", "D2, D3", "D4, D5", "D6, D7" and selected control data CD_Ss "10", "00", "00", "00" respectively corresponding thereto.

The read controller 1200 having received these provides user data UD "S0, D1, D2, D3, D4, D5, D6, D7" of 8 bytes and control data CD "10000000" of 1 byte in which the selected user data UD_Ss are combined and the control data CD_Ss are combined in the order of arrival, i.e., the user data UD and the control data CD of the pattern PTN3 shown in FIG. 7A, to the 64B/66B encoding circuit 200.

As for the write user data UD_W and the write control data CD_W written in addresses A4-A7, the user data UD "D8, D9, D10, D11, D12, D13, D14, T15" and control data CD "00000001" read in the same way as the above, i.e., the user data UD and control data CD of the pattern PTN12 shown in FIG. 7A are provided to the 64B/66B encoding circuit 200, triggered by the subsequent read starting phase RP.

In the case of n≧3, the user data UD and the control data CD of the pattern PTN4 shown in FIG. 7A obtained in the same way as the above are sequentially provided to the 64B/66B encoding circuit 200 between the user data UD and the control data CD of the pattern PTN3 and the user data UD and the control data CD of the pattern PTN12.

Thus, when the data length of the packet data PD is 8n−2 bytes, the user data UD with the highest efficiency of the packet data transfer without the idle byte C is provided to the 64B/66B encoding circuit 200, so that the encoding can be performed.

(2) Idle Period T_IDLE

During the idle period T_IDLE, as shown in FIG. 2, the writing in the memory MEM is not executed.

On the other hand, in the reading operation from the memory MEM, the memory controller 1300 having received the read starting phase RP from the read controller 1200 detects the period from the read starting phase RP to the reception of the subsequent read starting phase as a read unable period T_UR in which the reading from the memory MEM can not be made, since the reading from all of the addresses A0-A7 where the writing of the user data UD_W and the control data CD_W in the memory MEM has been completed at this point has already been executed.

At this time, the memory controller 1300 turns the read enable signal RS "OFF" to stop the reading from the memory MEM, and provides the available memory information EI indicating the read unable period T_UR to the selection circuit 1400.

The selection circuit 1400 having received the information EI generates the idle bytes C0-C7 of 8 bytes and control data "11111111" of 1 byte indicating the idle bytes, and provides to the read controller 1200 the idle bytes and the control data respectively divided into four, that are selected user data UD_Ss "C0, C1", "C2, C3", "C4, C5", "C6, C7", and selected control data CD_Ss "11", "11", "11", "11".

The read controller 1200 combines the selected user data UD_Ss and combines the control data CD_Ss again, and provides the user data UD "C0, C1, C2, C3, C4, C5, C6, C7" in which the idle byte of 8 bytes is set and the control data CD "11111111" of 1 byte, i.e., the user data UD and the control data CD of the pattern PTN1 shown in FIG. 7A, to the 64B/66B encoding circuit 200.

(3) Packet Data PD2 (13 Bytes (8n−3))

The writing in the memory MEM upon reception of the packet data PD2 until the tail information TI of the packet data PD2 is received is the same as the writing operation of the packet data PD1 of the above-mentioned (1).

When receiving the tail information TI "10", the identifying byte adder/control data generator 1100 recognizes that the data byte D13 is the tail of the packet data PD1, i.e., the data length "15 (13+2) bytes" of the user data UD generated by adding the head identifying byte S and the tail identifying byte T to the packet data PD2 is less than 16 (8n) bytes and lacking 1 byte, and generates write user data UD_W "T14, C15" of 16 bits in which an idle byte C15 is added after a tail identifying byte T14 and write control data CD_W "11" of 2 bits indicating the positions of the tail identifying byte T14 and the idle byte C15.

The identifying byte adder/control data generator 1100 writes both of the generated data in the memory MEM in the same way as the above (1).

Thus, in the reading operation from the memory MEM, in the same way as the above-mentioned (1), the user data UD and the control data CD of the pattern PTN3 are firstly provided to the 64B/66B encoding circuit 200, and then the user data UD "D8, D9, D10, D11, D12, D13, T14, C15" and control data CD "00000011", i.e., the user data UD and the control data CD of the pattern PTN11 shown in FIG. 7A are provided to the 64B/66B encoding circuit 200.

(4) Packet Data PD3 (12 Bytes (8n−4))

The writing in the memory MEM upon reception of the packet data PD3 until the tail information TI of the packet data PD3 is received is the same as that of the above-mentioned (1).

When receiving the tail information TI "01", the identifying byte adder/control data generator 1100, in the same way as the above-mentioned (1), generates write user data UD_W "D12, T13" of 16 bits in which a tail identifying byte T13 is added after the data byte D12, and the write control data CD_W "01" of 2 bits indicating the position of the tail identifying byte T13 to be written in the memory MEM. In the same way as the above-mentioned (3), the identifying byte adder/control data generator 1100 recognizes that the data length "14 (12+2) bytes" of the user data UD generated by adding the head identifying byte S and the tail identifying byte T to the packet data PD3 is less than 16 (8n) bytes and lacks 2 bytes, and generates write user data UD_W "C14, C15" in which idle bytes C14 and C15 are set and the write control data CD_W "11" indicating the idle bytes C14 and C15 to be written in the memory MEM.

Thus, in the reading operation from the memory MEM, in the same way as the above-mentioned (1), the user data UD and the control data CD of the pattern PTN3 are firstly provided to the 64B/66B encoding circuit 200, and then the user data UD "D8, D9, D10, D11, D12, T13, C14, C15" and control data CD "000000111", i.e., the user data UD and the control data CD of the pattern PTN10 shown in FIG. 7A are provided to the 64B/66B encoding circuit 200.

(5) Packet Data PD4 (11 Bytes (8n−5))

The writing in the memory MEM upon reception of the packet data PD4 until the tail information TI of the packet data PD4 is received is the same as that of the above-mentioned (1).

When receiving the tail information TI "01", the identifying byte adder/control data generator 1100, in the same way as the above-mentioned (3), generates write user data UD_W "T12, C13" of 16 bits in which the idle byte C13 is added after the tail identifying byte T12 and the write control data CD_W "11" of 2 bits indicating the positions of the tail identifying byte T12 and the idle byte C13 to be written in the memory MEM. The identifying byte adder/control data generator 1100 recognizes, in the same way as the above-mentioned (3) and (4), that the data length "13 (11+2) bytes" of the user data UD in which the head identifying byte S and the tail identifying byte T are added to the packet data PD4 is less than 16 (8n) bytes and lacks 3 bytes, and generates the write user data UD_W "C14, C15" of 16 bits in which the idle bytes C14 and C15 for 2 bytes except the idle byte C13 which has been already written in the memory MEM and the write control data CD_W "11" of 2 bits indicating the idle bytes C14 and C15 to be written in the memory MEM.

Thus, in the reading operation from the memory MEM, in the same way as the above-mentioned (1), the user data UD and the control data CD of the pattern PTN3 are firstly provided to the 64B/66B encoding circuit 200, and then the user data "D8, D9, D10, D11, T12, C13, C14, C15" and control data CD "00001111", i.e., the user data UD and the control data CD of the pattern PTN9 shown in FIG. 7A are provided to the 64B/66B encoding circuit 200.

When the data lengths of the packet data PD are 8n−3–8n−5 bytes as in the above-mentioned (3) -(5), the idle bytes C for 3 bytes at the maximum are included in the user data UD. Even in this case, the packet data transfer efficiency is higher than that of the user data UD of a pattern PTN2 (including idle bytes C0-C3 for 4 bytes) shown in FIG. 7A.

II. Embodiment [2] FIGS. 3 and 4

II.1. Arrangement: FIG. 3

The 64B/66B encoding data generation circuit 1000 according to the embodiment [2] of the present invention shown in FIG. 3 has, in addition to the arrangement of the above-mentioned embodiment [1], a maintenance information collector 1500 for collecting maintenance information MI of 8n−2 bytes (n≧2) from the outside to be provided to the selection circuit 1400.

II.2. Operation Example: FIG. 4

Hereinafter, the operation of this embodiment will be described by taking as an example the case where the maintenance information MI comprises, as shown in FIG. 4, data of 14 bytes (8n−2 bytes: n=2). It is to be noted that the following description can be similarly applied to the case where n≧3.

The read controller 1200, different from the above-mentioned embodiment [1], sets the period of the read starting phase RP per 8 clocks of the internal clock CLK_I (user data of 16 bytes twice that of the above-mentioned embodiment [1] can be inserted in this period), thereby enabling the maintenance user data of 16 bytes in which the head identifying byte S0 and the tail identifying byte T15 are respectively added to the head (before the data byte M1) and the tail (after the data byte M14) of the maintenance information MI to be received as the selected user data UD_S from the selection circuit 1400.

During the idle period T_IDLE, the memory controller 1300 having received the read starting phase RP from the read controller 1200, in the same way as the above-mentioned embodiment [1], detects the read unable period T_UR in which the reading from the memory MEM can not be made, stops reading from the memory MEM by turning the read enable signal RS "OFF", and provides the available memory information EI indicating the read unable period T_UR to the selection circuit 1400.

The selection circuit 1400 having received the information EI, different from the above-mentioned embodiment [1], generates maintenance user data "S0, M1-M14, T15" of 16 bytes and control data "100 . . . 001" of 2 bytes indicating the positions of both of the identifying bytes S0 and T15, and provides to the read controller 1200 the maintenance user data and the control data respectively divided into eight, that are selected user data UD_Ss "S0, M1", "M2, M3", . . . , "M14, T15" and selected control data CD_Ss "10", "00", . . . "01".

The read controller 1200 again combines the selected user data UD_Ss and the control data CD_Ss, and sequentially provides to the 64B/66B encoding circuit 200 maintenance user data "S0, M1, M2, M3, M4, M5, M6, M7" (corresponding to pattern PTN3) and "M8, M9, M10, M11, M12, M13, M14, T15" (corresponding to pattern PTN12) by 8 bytes, and the control data CD "10000000" and "00000001" respectively corresponding to the maintenance user data.

It is to be noted that the present invention is not limited by the above-mentioned embodiments, and it is obvious that various modifications may be made by one skilled in the art based on the recitation of the claims.

What is claimed is:

1. A 64B/66B encoding data generation method comprising:
   a first step of generating, when packet data, and head and tail information of the packet data are received, user data in which a head and tail identifying bytes are respectively added to a head and a tail of the packet data based on the head and tail information, and control data indicating positions of both of the identifying bytes in the user data;
   a second step of writing the user data associated with the control data in a memory sequentially from a predetermined address of the memory; and
   a third step of sequentially reading user data by 8 bytes and the control data corresponding to the user data from the predetermined address of the memory, to be provided to a 64B/66B encoding circuit.

2. The 64B/66B encoding data generation method as claimed in claim 1, wherein the third step includes a step of generating, when a period in which the reading from the memory can not be made is detected, idle bytes for 8n bytes ($n \geq 1$) and control data indicating the idle bytes during the period, to be provided to the 64B/66B encoding circuit.

3. The 64B/66B encoding data generation method as claimed in claim 1, wherein the first step includes a step of adding, when a data length of the user data is less than 8n bytes ($n \geq 2$), idle bytes for lacking bytes to the tail of the user data, and of adding data indicating positions of the idle bytes to the control data.

4. The 64B/66B encoding data generation method as claimed in claim 1, further comprising a fourth step of collecting maintenance information of 8n−2 bytes ($n \geq 2$) from outside, wherein
   the third step including a step of generating, when a period in which the reading from the memory can not be made is detected, maintenance user data of 8n bytes in which the head and tail identifying bytes are respectively added to a head and a tail of the maintenance information, and control data indicating positions of both of the identifying bytes in the maintenance user data during the period, to be provided to the 64B/66B encoding circuit.

5. The 64B/66B encoding data generation method as claimed in claim 1, wherein the packet data comprises an Ethernet packet or an IP packet.

6. A 64B/66B encoding data generation circuit comprising:
   a first portion generating, when packet data, and head and tail information of the packet data are received, user data in which a head and tail identifying bytes are respectively added to a head and a tail of the packet data based on the head and tail information, and control data indicating positions of both of the identifying bytes in the user data;
   a second portion writing the user data associated with the control data in a memory sequentially from a predetermined address of the memory; and
   a third portion sequentially reading user data by 8 bytes and the control data corresponding to the user data from the predetermined address of the memory, to be provided to a 64B/66B encoding circuit.

7. The 64B/66B encoding data generation circuit as claimed in claim 6, wherein the third portion includes a portion generating, when a period in which the reading from the memory can not be made is detected, idle bytes for 8n bytes ($n \geq 1$) and control data indicating the idle bytes during the period, to be provided to the 64B/66B encoding circuit.

8. The 64B/66B encoding data generation circuit as claimed in claim 6, wherein the first portion includes a portion adding, when a data length of the user data is less than 8n bytes ($n \geq 2$), idle bytes for lacking bytes to the tail of the user data, and adding data indicating positions of the idle bytes to the control data.

9. The 64B/66B encoding data generation circuit as claimed in claim 6, further comprising a fourth portion collecting maintenance information of 8n−2 bytes ($n \geq 2$) from outside, wherein
   the third portion including a portion generating, when a period in which the reading from the memory can not be made is detected, maintenance user data of 8n bytes in which the head and tail identifying bytes are respectively added to a head and a tail of the maintenance information, and control data indicating positions of both of the identifying bytes in the maintenance user data during the period to be provided to the 64B/66B encoding circuit.

10. The 64B/66B encoding data generation circuit as claimed in claim 6, wherein the packet data comprises an Ethernet packet or an IP packet.

\* \* \* \* \*